United States Patent [19]

Gerard et al.

[11] Patent Number: 5,025,228

[45] Date of Patent: Jun. 18, 1991

[54] ULTRASTABLE OSCILLATOR FUNCTIONING AT ATMOSPHERIC PRESSURE AND UNDER VACUUM

[75] Inventors: Evelyne Gerard, Maisons-Lafitte; Roger Molle, Antony; Andre Debaisieux, Herblay, all of France

[73] Assignee: Compagnie D'Electronique et de Piezo-Electricite C.E.P.E., Argenteuti, France

[21] Appl. No.: 460,969

[22] PCT Filed: Jun. 16, 1989

[86] PCT No.: PCT/FR89/00307

§ 371 Date: Apr. 11, 1990

§ 102(e) Date: Apr. 11, 1990

[87] PCT Pub. No.: WO89/12929

PCT Pub. Date: Dec. 28, 1989

[30] Foreign Application Priority Data

Jun. 24, 1988 [FR] France ............... 8808523

[51] Int. Cl.⁵ ............... H03B 5/32; H03L 1/04
[52] U.S. Cl. ............... 331/69; 219/210; 310/343
[58] Field of Search ............... 331/68, 69; 310/340–344; 219/210

[56] References Cited

U.S. PATENT DOCUMENTS 3,007,023 10/1961 Johnston ............... 219/19
3,252,109 5/1966 White ............... 331/69
3,617,692 11/1971 Landis ............... 219/210

FOREIGN PATENT DOCUMENTS 0142410 5/1985 European Pat. Off. .
1806114 5/1970 Fed. Rep. of Germany .
2360398 6/1975 Fed. Rep. of Germany .
700180 2/1931 France .

Primary Examiner—Siegfried H. Grimm
Attorney, Agent, or Firm—Oblon, Spivak, McClelland, Maier & Neustadt

[57] ABSTRACT

A piezoelectric resonator (1) consists of a piezoelectric reed (2) encased in a housing composed of a cap (7) and a base (8). The resonator (1) is placed in a thermostatically controlled containment (10). The thermostatically controlled containment (10) consists of an inner cell (40) which is screwed into an outer cell (30). These cells (30, 40) each possess sides (34, 44) and a bottom (35, 45). A thermal seal (16) is inserted between the bottom (35) of the outer cell (30) and the bottom (45) of the inner cell (40). The cap (7) of the resonator is soldered over its entire outer surface to the sides (44) and to the bottom (45) of the inner cell (40). The thermostatically controlled containment (10) is placed in a secondary containment (21). A narrow space (22) separates the two containments (10, 21), and the surface of the contact between the two containments is as small as possible. The invention is used for ultrastable on-board oscillators.

16 Claims, 1 Drawing Sheet

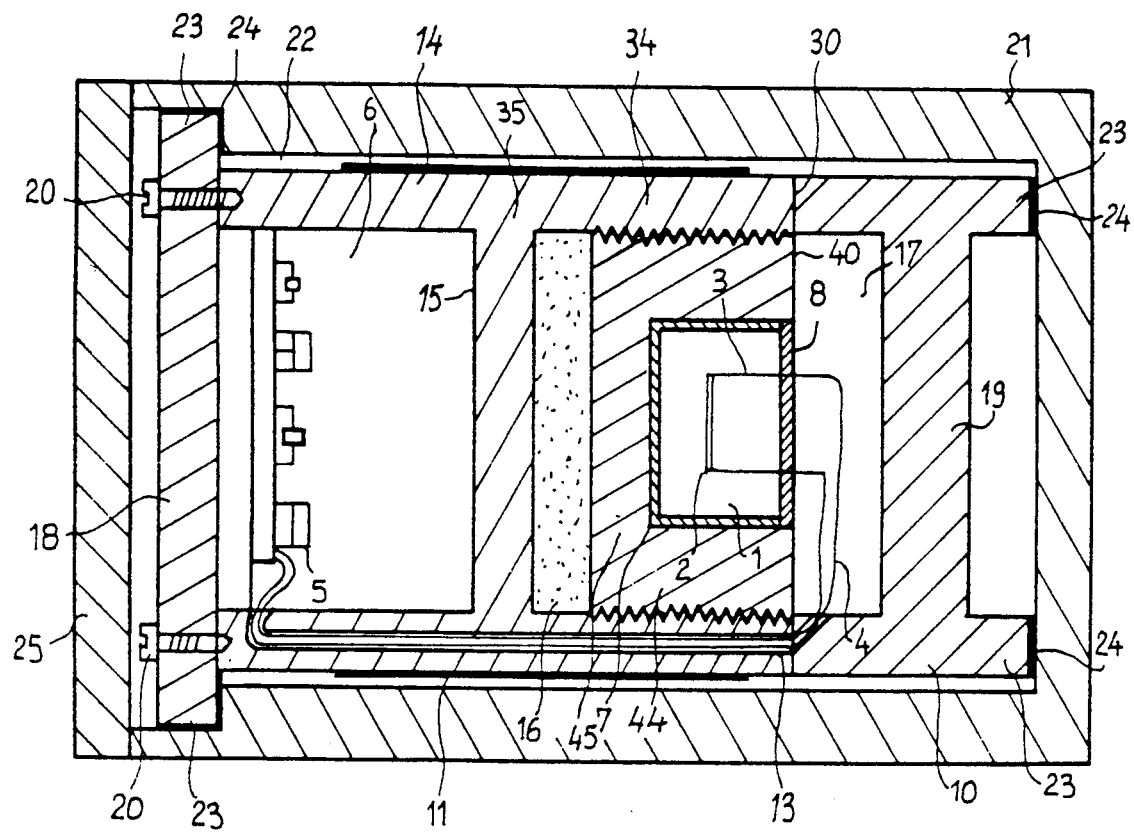

ULTRASTABLE OSCILLATOR FUNCTIONING AT ATMOSPHERIC PRESSURE AND UNDER VACUUM

The present invention relates to a piezoelectric resonator oscillator of ultrastable frequency and functioning both at atmospheric pressure and under vacuum.

Piezoelectric resonator oscillators constitute time bases for a large number of instruments. These time bases have to be as accurate as possible. There are many parameters having a bearing on the frequency stability, namely temperature, pressure, vibrations, shocks, age, starting and stopping, etc. Temperature and pressure variations particularly exert considerable influence on the frequency stability of a piezoelectric resonator oscillator.

The oscillators on board satellites must function with a high frequency stability, both at atmospheric pressure before launching and under vacuum when the satellite is in orbit. Moreover, temperature variations do not occur in the same way under vacuum or in the atmosphere because in a vacuum there is no convection.

The materials used in the oscillators intended for functioning both under vacuum and at atmospheric pressure must satisfy a certain number of criteria. They must first conform to the rules of space, especially as regards the condensate ratio and the rate of weight loss. They must also guarantee a low variation of thermal resistance, so as to minimise the temperature variations during the transition from atmospheric pressure to a vacuum, and vice versa.

Ultrastable piezoelectric resonator oscillators of known type are usually inserted in a Dewar vessel, in order to guarantee good thermal insulation relative to the exterior.

The present invention provides a piezoelectric resonator oscillator of ultrastable frequency, the frequency stability performances of which are obtained by means of an assembly making it possible to avoid using a Dewar vessel.

The present invention provides an oscillator of ultrastable frequency functioning at atmospheric pressure and under vacuum, comprising a piezoelectric resonator consisting of a piezoelectric reed encased in a housing composed of a cap and of a base, the resonator being placed inside a thermostatically controlled containment comprising sides limited by a bottom and by at least one cover, characterized in that the thermostatically controlled containment consists of an outer cell possessing a bottom and sides and of an inner cell possessing a bottom and sides, the inner cell being inserted in the outer cell in such a way that their sides are in contact, and in that the bottom of the thermostatically controlled containment has at least the bottom of the outer cell and the bottom of the inner cell.

The inner cell can be screwed into the outer cell.

A soft thermal seal can be inserted between the bottom of the inner cell and the bottom of the outer cell.

The cap of the resonator can be soldered on its entire outer surface to the inside of the inner cell.

The thermostatically controlled containment will be inserted into an intermediate containment, a narrow space being formed between the two containments, so as to minimise convection phenomena when work is being carried out at atmospheric pressure.

The inner surface of the intermediate containment will be bright in order to minimise thermal losses as a result of the radiation of the thermostatically controlled containment.

The invention will be better understood and other advantages will emerge from the following description given in a non-limiting way and accompanied by the single figure which illustrates a sectional view of an ultrastable piezoelectric resonator oscillator according to the invention.

In this figure, the piezoelectric resonator 1 comprises a reed of piezoelectric material 2 held by two conductive posts 3, to which are fastened electric wires 4 making the electrical connection with an oscillator circuit 5.

The piezoelectric reed 2 is encased in a housing consisting of a cap 7 and of a base 8. The resonator 1 is placed inside a thermostatically controlled containment 10 comprising a bottom 15 and sides 14.

As in our figure, the thermostatically controlled containment 10 can consist of two cavities 6, 17 arranged back to back and possessing the same bottom 15.

The first cavity 6 contains the electronic circuit 5 forming the piezoelectric oscillator. In fact, for the oscillator to operate properly, it is preferable if this electronic circuit 5 is placed in a thermostatically controlled containment. The second cavity 17 contains the piezoelectric resonator 1.

In the embodiment illustrated in our figure, the second cavity of the thermostatically controlled containment 10 consists of an outer cell 30, into which is fitted an inner cell 40. The two cells 30, 40 are fixed relative to one another. The outer cell 30 possesses sides 34 and a bottom 35. The inner cell 40 possesses sides 44 and a bottom 45. The two cells 30, 40 are in direct contact at least by way of their sides 34, 44.

In this embodiment, the cap 7 of the piezoelectric resonator 1 is in contact, over the entire outer surface, with the sides 44 and the bottom 45 of the inner cell 40. This contact can be made by soldering.

Since the cap 7 is generally of cylindrical form, the inner cell 40 will also be of cylindrical form. Its sides 44 can carry a screw pitch on their outer surface. The inner cell 40 can be screwed into the outer cell 30. The sides 34 of the outer cell 30 will also carry a screw pitch of suitable dimensions on their inner surface. The two cells will thus be fixed relative to one another.

A thermal seal 16 made of soft metallic material is inserted between the bottom 35 of the outer cell 30 and the bottom 45 of the inner cell 40. This seal 16 is compressed when the inner cell 40 is screwed into the outer cell 30. It makes it possible to improve the thermal conduction between the resonator 1 and the thermostatically controlled containment 10. This thermal seal 16 is produced from a metallic material which is a good conductor of heat, such as indium, gold, silver, copper, etc.

The sides 14 of the second cavity 17 of the thermostatically controlled containment consist of the sides 44 of the inner cell 40 which are screwed into the sides 34 of the outer cell 30. The bottom 15 of the thermostatically controlled containment consists of the bottom 45 of the inner cell 40, covered with the seal 16, itself covered with the bottom 35 of the outer cell 30.

The structure just described gives good results in terms of thermal stability. Its advantage is that it can be dismounted in the event of a failure of the piezoelectric resonator 1.

Furthermore, the thermostatically controlled containment 10 possesses a plurality of heating elements 11 distributed over its outer surface. The heating elements 11 are, for example, power transistors, the thermal resistances of which are selected so as to be the lowest possible, to ensure a better transfer of heat to the outer surface of the thermostatically controlled containment 10. The power transistors can be fastened to the outer surface of the thermostatically controlled containment 10 by vapour-phase soldering.

The number of heating elements 11 is larger than or equal to two, in order to ensure a good distribution of the heat in the thermostatically controlled containment 10.

The connecting wires 4, at their exit from the piezoelectric resonator 1, pass into a conduit, 13 arranged in the thickness of one side 34 of the outer cell 30. The conduit is extended in the thickness of one side of the first cavity 6. The contact wires 4 are connected to the electronic circuit 5 constituting the oscillator located inside the first cavity 6.

The two cavities 6, 17 forming the thermostatically controlled containment 10 each possess a cover 18, 19. The covers 18, 19 can be fastened to the thermostatically controlled containment by means of screws. Only the screws 20 of the cover 18 have been shown in our figure.

The thermostatically controlled containment 10 is introduced into a closed secondary containment 21. The internal form of the secondary containment 21 matches the external form of the thermostatically controlled containment 10. A narrow space 22 is formed between the walls of the two containments 10, 21. This space 22, the size of which is approximately a few millimetres, makes it possible to minimise the convection when work is being carried out at atmospheric pressure. The two containments are in contact only in the region of protuberances 23 located, for example, on the covers 18, 19 of the thermostatically controlled containment 10. The protuberances 23 can be fastened to the secondary containment 21, for example by means of screws, in order to fix the two containments 10, 21 relative to one another. In our figure, we have not shown any fastening means between the two containments. These protuberances could also be located on the outer surface of the thermostatically controlled containment 10 or even on the inner surface of the secondary containment 21. Thermal breaks 24 are inserted at the end of each protuberance 23 in the region of contact with the secondary containment 21. These thermal breaks 24 are produced from a thermally insulating material, such as a resin containing glass fibres.

They contribute to the thermal insulation of the thermostatically controlled containment 10.

The inner surface of the secondary containment 21 will undergo surface treatment, such as bright tinning, so as to obtain a low emission capacity. This will make it possible to minimise the radiation losses which occur when work is being carried out under a vacuum.

The secondary containment 21 is closed by means of a cover 25 which can be fixed to the secondary containment 21 by means of screws. These screws have not been shown in our figure. The secondary containment 21 can be introduced into a housing constituting the housing of the ultrastable oscillator. This housing has not been shown, to avoid overloading the figure.

The thermostatically controlled containment 10 is produced from a material having a thermal conductivity of the order of 380 W/m.° C. and a specific heat between 0° C. and 100° C. of the order of 0.38 kJ/kg.° C. Copper, aluminium or an alloy of these two metals are perfectly suitable for producing the thermostatically controlled containment 10. Each cell can be produced from one of the materials mentioned above. The covers 18, 19 of the thermostatically controlled containment 10 will likewise be produced from a material mentioned above. The thermostatically controlled containment will be tinned over its entire outer surface, to allow the soldering of the heating elements 11.

Its inner surface will likewise be tinned, so that the cap 7 of the resonator 1 is soldered directly to the inside of the thermostatically controlled containment. The inner surface of the inner vessel will be soldered so that the cap 7 of the piezoelectric resonator 1 can be fastened to it. The cap 7 of the resonator 1 is generally made of gold-plated copper.

The secondary containment 21 is likewise produced from a material which is a good conductor of heat. The same materials can be used for the two containments 10, 21.

We claim:

1. Oscillator of ultrastable frequency functioning at atmospheric pressure and under vacuum, comprising:
    a piezoelectric resonator having a piezoelectric reed encased in a housing having a cap and a base;
    the resonator being placed inside a thermostatically controlled containment comprising sides limited by a bottom and by at least one cover, wherein the thermostatically controlled containment comprises an outer cell possessing a bottom and sides and an inner cell possessing a bottom and sides, the inner cell being fitted into the outer cell in such a way that their sides are in direct contact; and
    wherein the bottom of the thermostatically controlled containment has at least the bottom of the outer cell and the bottom of the inner cell.

2. Oscillator according to claim 1, wherein the cap is soldered over its entire outer surface to the inside of the inner cell.

3. Oscillator according to one of claims 1 or 2, wherein the inner cell is screwed into the outer cell, the sides of the inner cell and the sides of the outer cell each carrying a screw pitch.

4. Oscillator according to claim 1, wherein a thermal seal is inserted between the bottom of the outer cell and the bottom of the inner cell.

5. Oscillator according to claim 4, wherein the thermal seal is made of a soft metal which is a good conductor of heat.

6. Oscillator according to one of claims 4 or 5, wherein the seal is selected from metals such as indium, gold, silver, copper.

7. Oscillator according to claim 1, wherein the, inner cell and the outer cell are each produced from a material which is a good conductor of heat, such as copper, aluminum or an alloy of these metals.

8. Oscillator according to claim 1, wherein the thermostatically controlled containment is introduced into a closed secondary containment, the internal form of the secondary containment matching the external form of the thermostatically controlled containment, a narrow space being formed between the two containments in order to minimize the convection phenomena.

9. Oscillator according to claim 8, wherein the narrow space is of the order of a few millimeters.

10. Oscillator according to one of claims 8 or 9, wherein contact points are formed between the two containments by protuberances fixed to at least one of the containments.

11. Oscillator according to claim 10, wherein the surface, of contact between the two containments is as small as possible.

12. Oscillator according to claim 10, wherein a thermal break is placed on each protuberance, said thermal break insulating the two containments thermally.

13. Oscillator according to claim 12, wherein thermal break is produced from a material, such as resin containing glass fibres.

14. Oscillator according to claim 8, wherein the inner surface of the secondary containment is brightened by tinning, in order to minimize the radiation losses.

15. Oscillator according to claim 8, wherein the secondary containment is produced form a material which is a good conductor of heat, such as copper, aluminum or an alloy of these metals.

16. Oscillator according to claim 1, wherein the thermostatically controlled containment comprises:

two cavities arranged back to back, said cavities being separated by the same bottom and closed by means of covers, the first cavity containing an electronic circuit of the oscillator and the second cavity containing the resonator.

* * * * *